United States Patent [19]
Hachiya

[11] Patent Number: 5,991,185
[45] Date of Patent: Nov. 23, 1999

[54] SEMICONDUCTOR MEMORY

[75] Inventor: Yutaro Hachiya, Tokyo, Japan

[73] Assignee: NEC Corporation, Tokyo, Japan

[21] Appl. No.: 09/129,894

[22] Filed: Aug. 6, 1998

[30] Foreign Application Priority Data

Aug. 8, 1997 [JP] Japan ..................................... 9-227394

[51] Int. Cl.[6] .............................. G11C 5/06; H01L 23/48
[52] U.S. Cl. ............................................. 365/63; 257/690
[58] Field of Search .............................. 365/63; 257/202, 257/203, 678, 690

[56] References Cited

U.S. PATENT DOCUMENTS

| | | | |
|---|---|---|---|
| 4,860,087 | 8/1989 | Matsubara et al. ....................... | 357/68 |
| 5,019,889 | 5/1991 | Yoshio et al. .............................. | 357/42 |
| 5,300,796 | 4/1994 | Shintani .................................. | 257/203 |
| 5,347,145 | 9/1994 | Tanaka et al. ............................ | 257/48 |
| 5,700,975 | 12/1997 | Takata et al. ........................... | 257/690 |

FOREIGN PATENT DOCUMENTS 63-267598  11/1988  Japan .

*Primary Examiner*—David Nelms
*Assistant Examiner*—Anh Phung
*Attorney, Agent, or Firm*—McGinn & Gibb, P.C.

[57] ABSTRACT

In a semiconductor memory of the present invention, a group of electrode pads for connecting the semiconductor memory to the outside and assigned to a plurality of same functions are arranged on the surface of a memory pellet in both of the first and second quadrants divided by the center line of the memory pellet. With a single semiconductor pellet, there can be implemented both of face-up and face-down pellet mounting on a package.

16 Claims, 6 Drawing Sheets

SEMICONDUCTOR MEMORY

BACKGROUND OF THE INVENTION

The present invention relates to a semiconductor memory with a semiconductor pellet on which electrode pads are arranged for connecting the integrated circuit of the pellet to a package and a wiring substrate. More particularly, in various kinds of packages including a ball grid array (BGA) package and a chip scale package (CSP) implementing a multipin configuration and desirable in the mounting aspect, the present invention is concerned with a semiconductor memory having a unique electrode pad arrangement which allows a single pellet to be mounted on a package face up or face down, as desired.

Generally, the pin arrangements of packages are standardized in the semiconductor industry including the users of semiconductor memories and vendors. If a BGA package directed toward a miniature product and a CSP directed toward a further miniature product are compatible with respect to the pin arrangement, then the CSP can be substituted for the BGA package in order to reduce the mounting area, as needed. In such a case, whether a pellet should be mounted on a package face up, i.e., with its front facing the same side as the front of the package or whether it should be mounted on a package face down, i.e., with its front facing the opposite side to the front of the package is sometimes unconditionally determined by the kind of the package. Specifically, a pellet is, in many cases, mounted on a BGA package face up and mounted on a CSP face down.

Japanese Patent Laid-Open Publication No. 63-267598, for example, discloses a semiconductor device allowing pad electrodes assigned to the same function to be connected to the outside terminals of a mounting substrate in either one of the face-up configuration and face-down configuration. Specifically, an electrode pad for the face-up position and an electrode pad for the face-down position are provided in a pellet for a single signal and electrically connected within the pellet. This device makes it needless to prepare different pellets each having a particular pad arrangement.

However, the semiconductor device taught in the above document has some problems left unsolved, as follows. The device doubles the number of electrode pads required and thereby increases the production cost as well as the area to be allocated to the pellet, compared to a pellet to be mounted only in a single position. For example, a thirty-two K words, thirty-six bit width SRAM (Static Random Access Memory) has sixty-two electrode pads relating to function pins, i.e., fifteen pads for addresses, thirty-six pads for data, and eleven pads for control. Taking the data function pins alone as an example, thirty-six additional pads are necessary in order to cope with both of face-up and face-down mounting, meaning an increase by about 60%. Further, an increase in the area of the pellet ascribable to wirings connecting the pads within the pellet is not negligible and has substantial influence on the production cost when it comes to products having small pellet areas, i.e., inexpensive general-purpose memories. In addition, as for a high-speed memory featuring high-speed access and high-speed operation, the wirings extending across the pellet critically aggravate a delay time. The above semiconductor device is therefore not feasible for inexpensive memory products or high-speed memory products.

To implement both of face-up mounting and face-down mounting with a single pellet, at least one additional wiring layer must be formed in the substrate of a CSP. This also results in an increase in the cost of a memory product.

SUMMARY OF THE INVENTION

It is therefore an object of the present invention to provide a semiconductor memory allowing a single semiconductor pellet to implement both of face-up mounting and face-down mounting and thereby reducing the production cost of a pellet and that of a package while insuring desirable memory performance.

In accordance with the present invention, in a semiconductor memory, a group of electrode pads for connecting the semiconductor memory to the outside and assigned to a plurality of same functions are arranged on the surface of a memory pellet in both of the first and second quadrants divided by the center line of the memory pellet.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

Figure 1:
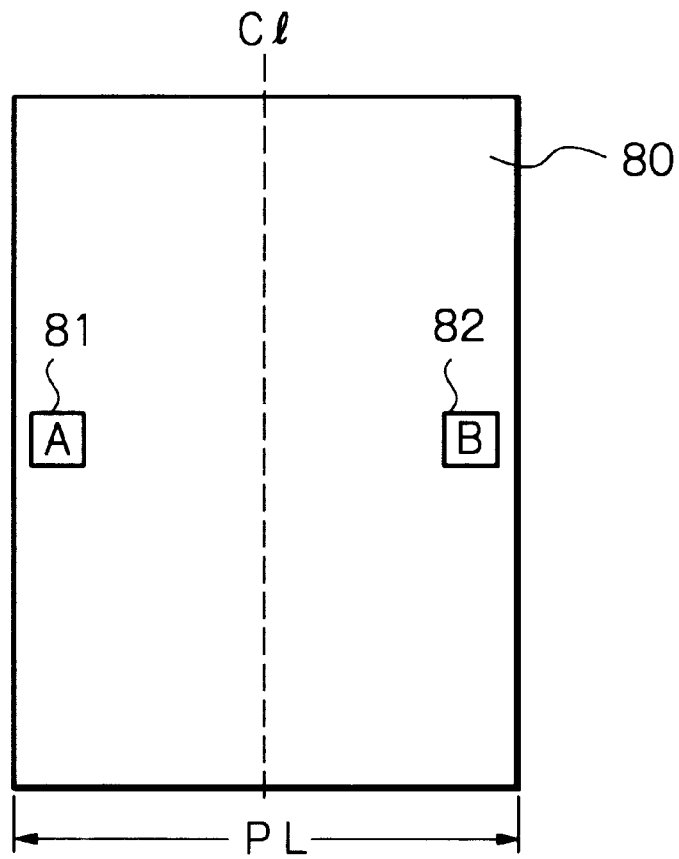
FIG. 1 shows a pellet included in a conventional semiconductor memory.

To better understand the present invention, reference will be made to a conventional semiconductor memory. First, means for coping with two possible positions of a pellet will be described. FIG. 1 shows a memory pellet 80 including electrode pads 81 and 82 assigned to different functions A and B, respectively. The pellet 80 may be turned by 180 degrees about its center line c1 to a face-up position or a face-down position, as desired.

Figure 2:
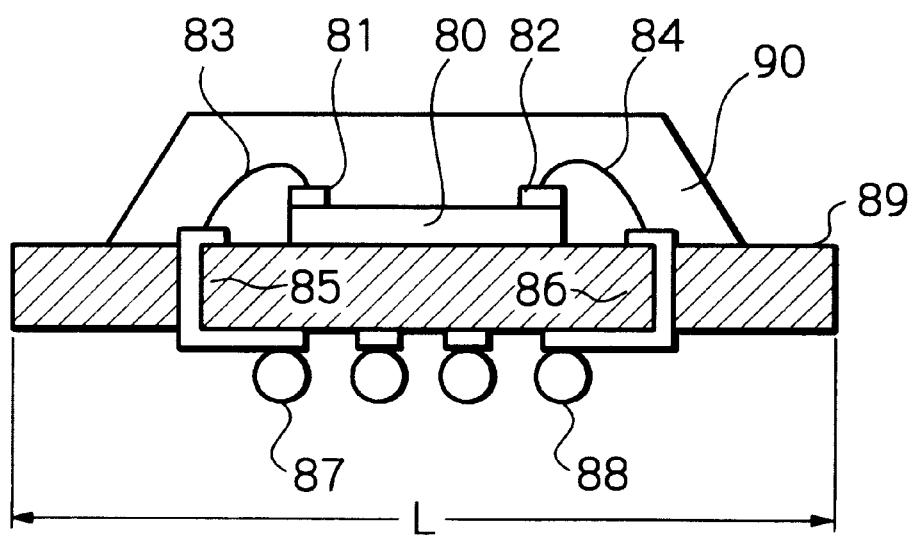
FIG. 2 is a section showing a first BGA package configuration in which the pellet of FIG. 1 is mounted face up.

FIG. 2 is a section along a line connecting the pads 81 and 82 and showing the pellet 80 mounted on a BGA package face up. As shown, bonding wires 83 and 84 connect the pellet 80 and package and are assigned to the functions A and B, respectively. Wirings 85 and 86 are arranged in the package and respectively assigned to the functions A and B.

Balls, or pins, 87 and 88 are respectively assigned to the functions A and B and play the role of the outside terminals of the package. The reference numerals 89 and 90 designate the substrate and seal resin of the package, respectively. The package has a width L.

Figure 3:
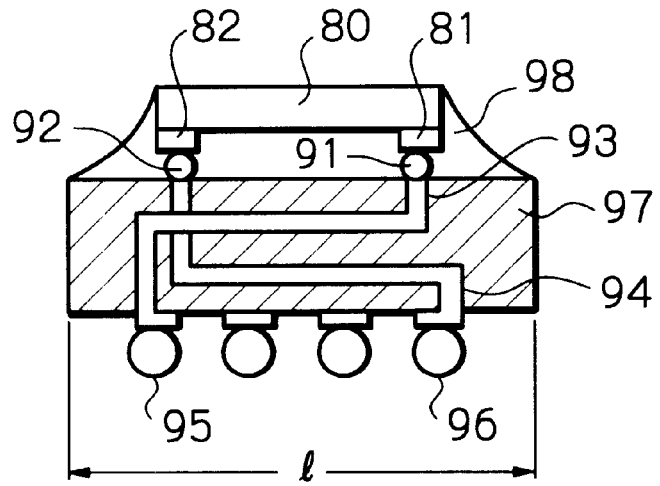
FIG. 3 is a section showing a first CSP configuration in which the pellet of FIG. 1 is mounted face up.

FIG. 3 is a section along a line connecting the pads 81 and 82 and showing the pellet 80 mounted on a CSP face down.

As shown, bumps 91 and 92 connect the pellet 80 and CSP and are assigned to the functions A and B, respectively. Wirings 93 and 94 are arranged in the CSP and respectively assigned to the functions A and B. Balls or pins 95 and 96 are respectively assigned to the functions A and B and play the role of the outside terminals of the CSP. There are also shown in FIG. 3 a CSP substrate 97 and a seal member 98 intervening between the pellet 80 and the substrate 97. The CSP has a width l.

Figure 4:
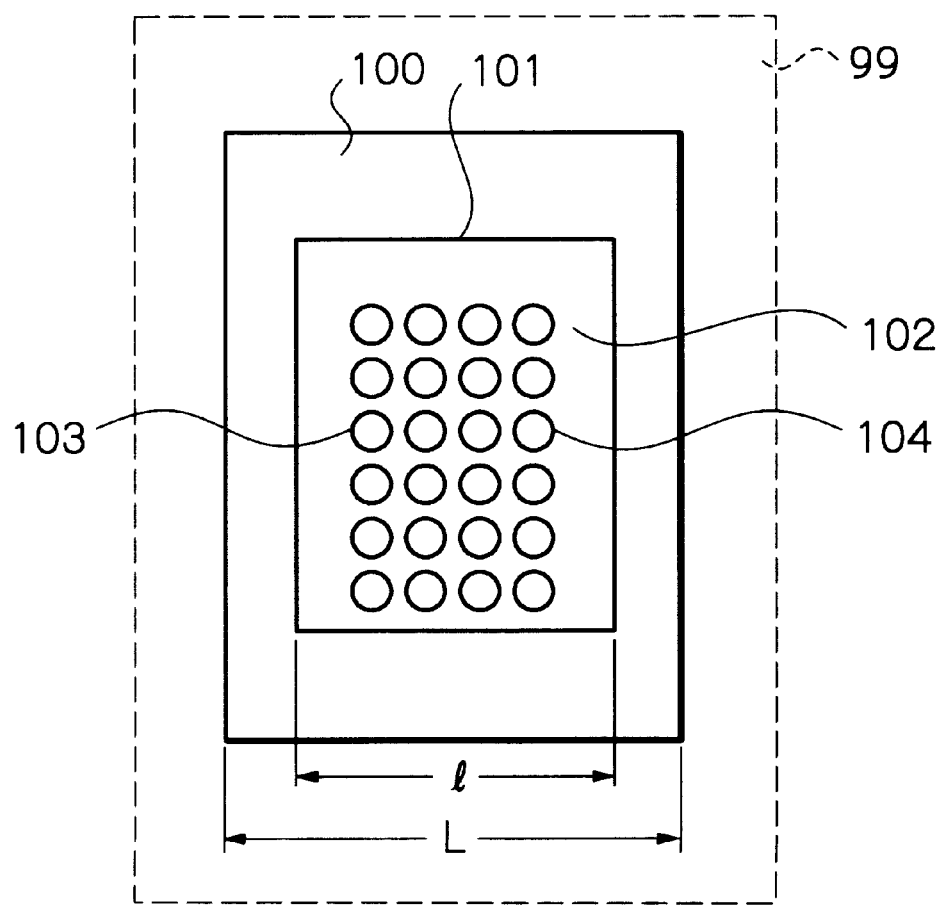
FIG. 4 shows a conventional electrode pad array provided on the substrate of a product.

FIG. 4 shows a part of a substrate 99 included in a product and on which a memory is mounted. As shown, the BGA package of FIG. 2 is mounted in an area delimited by a frame 100, or the CSP is mounted in an area delimited by a frame 101. An electrode pad array portion 102 is provided on the substrate and assigned to the memory. Circles in the pad array portion 102 are representative of electrode pads. Particularly, the pads labeled 103 and 104 correspond to the previously mentioned functions A and B, respectively. The BGA package and CSP respectively have the widths L and l also mentioned previously.

As shown in FIG. 2, the pellet 80 mounted on the BGA package is positioned face up. The function A is connected from the electrode pad 81 to the ball or outside terminal 87 by the bonding wire 83 and wiring 85 arranged in the substrate. Likewise, the function B is connected from the pad 82 to the ball or outside terminal 88 by the bonding wire 84 and wiring 86.

As shown in FIG. 3, the pellet 80 mounted on the CSP is positioned face down. The function A is connected from the electrode pad 81 to the outside terminal 95 by the bump 91 and wiring 93. Likewise, the function B is connected from the electrode pad 82 to the outside terminal 96 by the bump 92 and wiring 94. As the wirings 93 and 94 within the substrate 97 indicate, at least one additional wiring layer must be formed in the substrate 97 in order to implement horizontal wiring for a side change, so that the pins are adaptive to both of the BGA package and CSP. While only two signal lines are shown in FIG. 3, memories in general include many function pins.

As shown in FIG. 4, the above arrangement of wirings in the substrate allows, in the case of the BGA package, the outside terminals 87 and 88 for the functions A and B, respectively, to be connected to the electrode pads A (103) and B (104), respectively or allows, in the case of the CSP, the outside terminals 95 and 96 for the functions A and B, respectively, to be connected to the electrode pads A (103) and B (104), respectively. Generally, the width l of the CSP is closer to the pellet size than the width L of the BGA and can be made smaller than the width L, so that the following relation holds:

$$l < L \qquad (1)$$

While the above configurations have concentrated on a single memory mounted on a product, the reduction in mounting area achievable with the replacement of the BGA package with the CSP becomes more noticeable with an increase in the number of memories. A memory in the form of a BGA package is required when the mounting area does not have to be considered, while a memory in the form of a CSP is required when it has to be considered.

As stated above, two different package types, i.e., a face-up type and a face-down type are required of memories. To implement the two package types with a single pellet, at least one additional wiring layer is needed, as discussed with reference to FIG. 3. This increases the cost of the memory.

Further, in the conventional structures shown in FIGS. 1–4, at least one of the package substrate for the face-up application and the package substrate for the face-down application needs at least one additional wiring layer. This further increases the production cost.

A preferred embodiment of the semiconductor memory in accordance with the present invention will be described hereinafter. Briefly, the semiconductor memory to be described includes a group of electrode pads for connection to the outside and having the same function are arranged in each of a first and a second quadrant divided by a first center line of a pellet. Such a group of electrode pads may alternatively be arranged in each of a third and a fourth quadrant divided by a second center line perpendicular to the first center line. Further, the group of electrode pads may be arranged within a third center line perpendicular to the first center line and having a width which is one half of the length of the side of the pellet.

Figure 5:
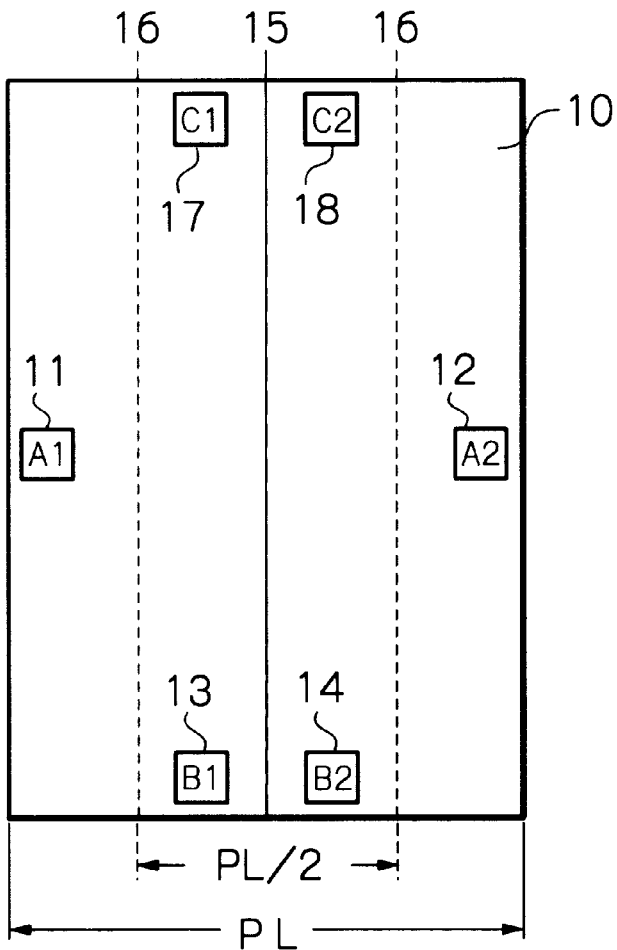
FIG. 5 is a pellet included in a semiconductor memory embodying the present invention.

Referring to FIG. 5, the semiconductor memory embodying the present invention is implemented as a pellet 10. Electrode pads 11 (A1) and 12 (A2) are assigned to a function A while electrode pads 13 (B1) and 14 (B2) are assigned to a function B different from the function A. The pellet 10 can be turned by 180 degrees about a center line 15 to a face-up position or a face-down position, as needed. Lines 16 delimit a finite width defining a center line. There are also shown in FIG. 5 electrode pads 17 (C1) and 18 (C2) assigned to another function C.

Figure 6:
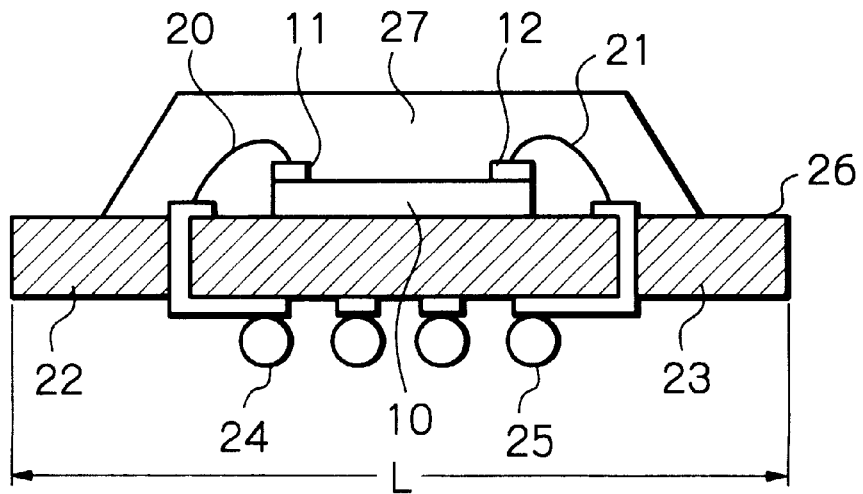
FIG. 6 is a section showing a first BGA package configuration in which the pellet of FIG. 5 is mounted face up.

FIG. 6 shows a BGA package on which the pellet 10 is mounted, particularly the electric connection of the package. As shown, bonding wires 20 and 21 respectively connect the electrode pads A1 and A2 assigned to the function A to the package. Wirings 22 and 23 are arranged in a substrate 26 included in the BGA package and correspond to the electrode pads A1 and A2, respectively. Balls, or pins, 24 and 25 correspond to the electrode pads A1 and A2, respectively, and play the role of the outside terminals of the package. The BGA package includes a seal resin 27 and has a width L.

Figure 7:
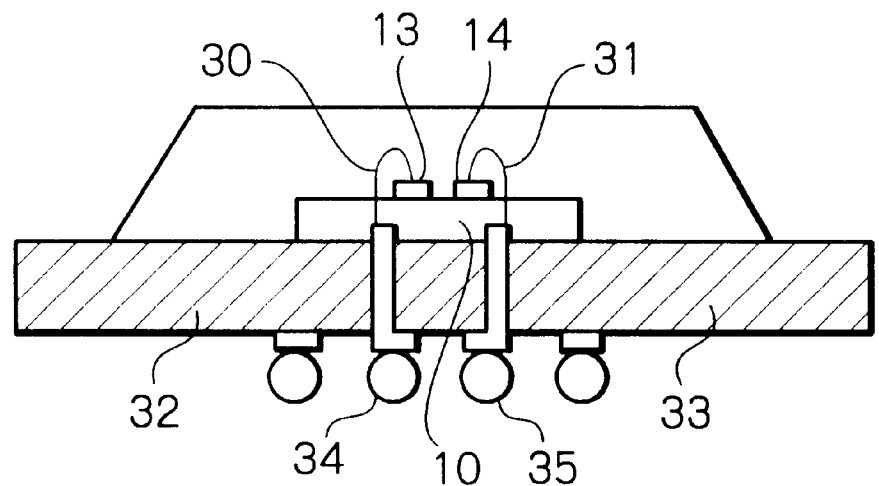
FIG. 7 is a section showing a second BGA package configuration in which the pellet of FIG. 5 is mounted face up.

FIG. 7 shows another BGA package on which the pellet is mounted. As shown, bonding wires 30 and 31 respectively connect the electrode pads B1 and B2 assigned to the function B to the BGA package. Wirings 32 and 33 are arranged in the substrate of the BGA package and respectively correspond to the electrode pads B1 and B2 assigned to the function B. Balls or pins 34 and 35 playing the role of the outside terminals are provided on the BGA package and correspond to the electrode pads B1 and B2, respectively.

Figure 8:
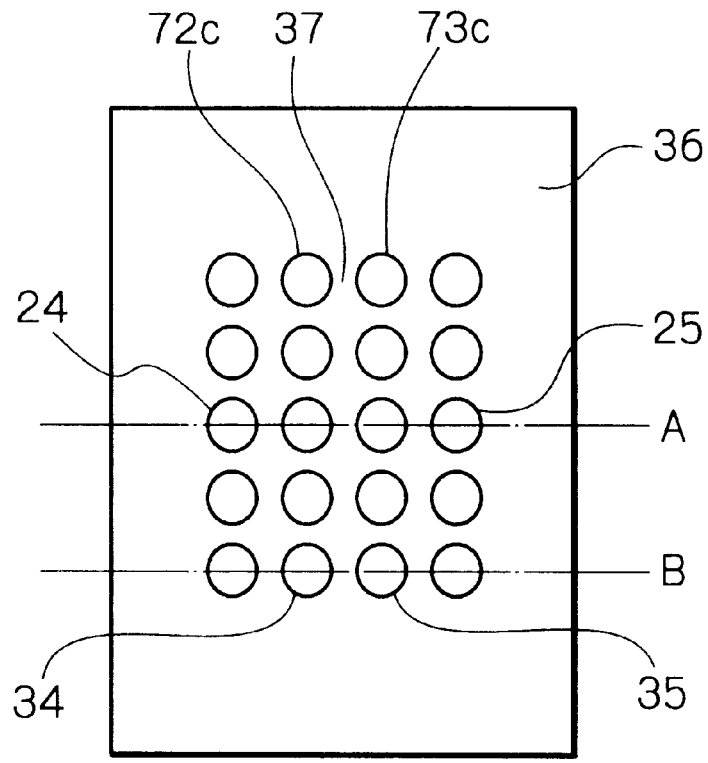
FIG. 8 is a perspective top view of the BGA package of the illustrative embodiment.

FIGS. 6 and 7 are respectively sections along lines A and B shown in FIG. 8. As shown in FIG. 8, the BGA package has a contour 36. A ball array 37 is arranged on the rear of the substrate of the BGA package. Balls 24, 25, 34 and 35 respectively correspond to the balls 24, 25, 34 and 35 shown in FIGS. 6 and 7. Further, balls 72c and 73c are arranged on the BGA package and serve as outside terminals, as will be described with reference to FIG. 12 later.

Figure 9:
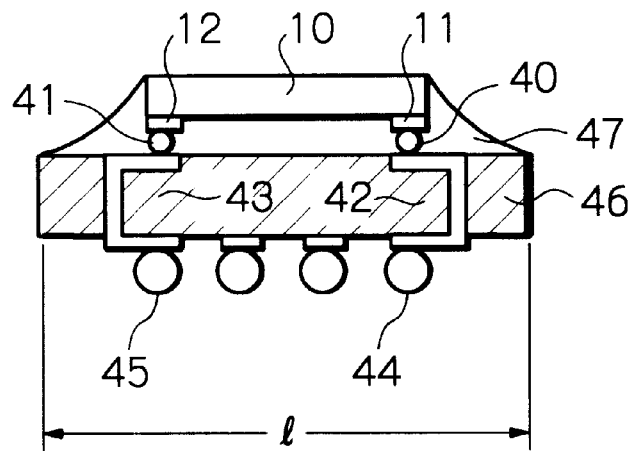
FIG. 9 is a section showing a first CSP configuration in which the pellet of FIG. 5 is mounted face down.

FIG. 9 shows a CSP on which the pellet 10 is mounted face down. As shown, bumps 40 and 41 respectively connect the electrode pads A1 and A2 assigned to the function A to the CSP. Wirings 42 and 43 are arranged in a substrate 46 included in the CSP and correspond to the electrode pads A1 and A2, respectively. Balls or pins 44 and 45 correspond to the electrode pads A1 and A2 and play the role of CSP outside terminals. The CSP includes a seal member intervening between the pellet and the substrate 46 and has a width l.

Figure 10:
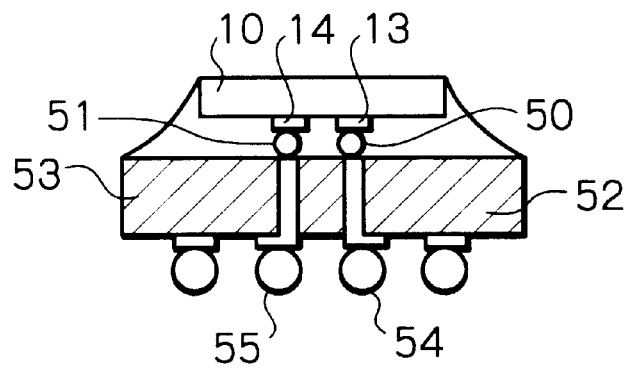
FIG. 10 is a section showing a second CSP configuration in which the pellet of FIG. 5 is mounted face down.

FIG. 10 shows another CSP on which the pellet 10 is mounted face down. As shown, bumps 50 and 51 respectively connect the electrode pads B1 and B2 assigned to the function B to the CSP. Wirings 52 and 53 are arranged in the substrate of the CSP and correspond to the electrode pads B1 and B2, respectively. Balls or pins 54 and 55 correspond to the electrode pads B1 and B2 and play the role of CSP outside terminals.

Figure 11:
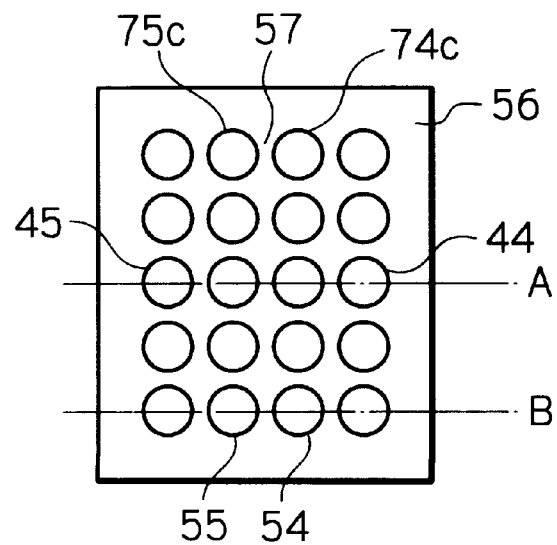
FIG. 11 is a perspective top view of the CSP package of the illustrative embodiment.

FIGS. 9 and 10 are respectively sections along lines A and B shown in FIG. 11. As shown in FIG. 11, the CSP has a contour 56. A ball array 57 is arranged on the rear of the CSP. Balls 44, 45, 54 and 55 respectively correspond to the balls 44, 45, 54 and 55 shown in FIGS. 9 and 10. Further, balls 74c and 75c are arranged on the CSP and play the role of outside terminals, as will be described with reference to FIG. 13.

Figure 12:
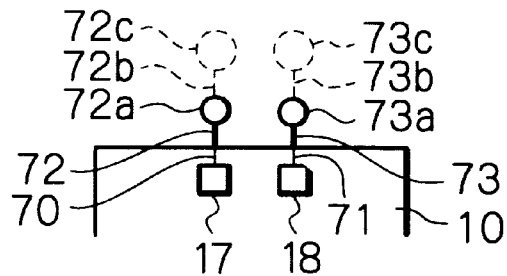
FIG. 12 shows an electrode pad array provided on t h e substrate of a product in the illustrative embodiment.

FIG. 12 shows, paying attention to the function C of the pellet 10 mounted on the BGA package face up, electrical connection from the electrode pads of the pellet to the balls or outside terminals of the package. As shown, bonding wires 70 and 71 respectively connect the electrode pads C1 (17) and C2 (18) assigned to the function C to the package. Wirings 72 and 73 are arranged in the uppermost layer of the substrate of the package and correspond to the pads C1 (17) and C2 (18), respectively. Likewise, wirings 72b and 73b are arranged in the lowermost layer of the substrate and correspond to the electrode pads C1 (17) and C2 (18). The uppermost layer and lowermost layer of the substrate are electrically connected to each other by lines 72a and 73a. Balls or pins 72c and 73c correspond to the electrode pads C1 (17) and C2 (18), respectively, and serve as the outside terminals of the package.

Figure 13:
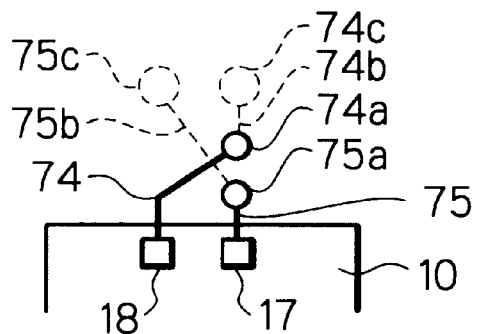
FIG. 13 is a top plan view showing a positional relation between electrode pads provided on the pellet and balls or outside terminals provided on the BGA package and holding in the face-up position of the illustrative embodiment.

FIG. 13 shows, paying attention to the function C of the pellet 10 mounted on the CSP face down, electrical connection from the electrode pads of the pellet to the balls or outside terminals of the CSP. As shown, a wiring 74 is arranged in the uppermost layer of the substrate of the package. The wiring 74 and a bump 75 respectively connect the electrode pads C2 (18) and C1 (17) to the CSP. Wirings 75b and 74b are arranged in the lowermost layer of the substrate of the CSP and correspond to the electrode pads C1 (17) and C2 (18), respectively. The uppermost layer and lowermost layer of the substrate are electrically connected to each other by lines 75a and 74a. Balls or pins 75a and 74c correspond to the electrode pads C1 (17) and C2 (18), respectively, and serve as the outside terminals of the CSP.

Figure 14:
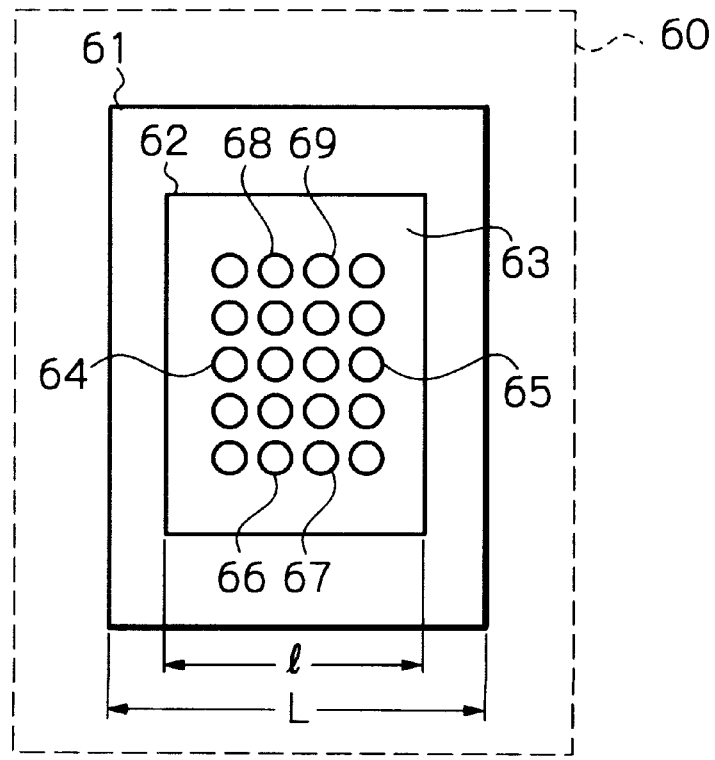
FIG. 14 is a top plan view showing a positional relation between the electrode pads provided on the pellet and balls or outside terminals provided on the CSP package and holding in the face-down position of the illustrative embodiment.

FIG. 14 shows a part of a substrate 60 included in a product and on which a memory is mounted. As shown, the BGA package of the illustrative embodiment is mounted in an area delimited by a frame 61, or the CSP of the illustrative embodiment is mounted in an area delimited by a frame 62. An electrode pad array portion 63 is provided on the substrate and assigned to the memory. Circles in the pad array portion 63 are representative of electrode pads. Particularly, the pads labeled 64 and 65 each corresponds to either one of the electrode pads A1 and A2 of the pellet assigned to the function A. Likewise, the electrode pads labeled 66 and 67 each corresponds to either one of the electrode pads B1 and B2 of the pellet assigned to the function B. Pads 68 and 69 are provided on the substrate of the product and correspond to the electrode pads C1 and C2 of the pellet assigned to the function C. Signals applied to the electrode pads 64, 65, 66, 67, 68 and 69 of the product respectively have functions a1 and a2 representative of the function A, functions b1 and b2 representative of the function B, and functions c1 and c2 representative of the function C. The BGA package and CSP have widths L and l, respectively.

The above functions include address selecting functions for accessing the individual memory cells; a particular number of functions matching with the capacity or the depth of the memory are provided. The functions also include data inputting and outputting functions each being assigned to a particular address; the number of functions is equal to the bit width of the memory product. While the functions A, B and C each is represented by two functions A1 and A2 (a1 and a2), B1 and B2 (b1 and b2) or C1 and C2 (c1 or c2), such a number of functions is only illustrative. The functions are, of course, not limited to the address selecting functions or the data inputting/outputting functions.

First, a case wherein pads assigned to the same function exist in the first and second quadrants divided by a center line will be described. As shown in FIG. 6, as for the BGA package, the pellet 10 is positioned face up. The electrode pad A1 (11) assigned to the function A is connected to the outside terminal 24 by the wire 20 and the wiring 22 of the substrate of the package. Likewise, the electrode pad A2 (12) also assigned to the function A is connected to the outside terminal 25 by the wire 21 and the wiring 23 of the substrate of the package. As shown in FIG. 14, in the case of the BGA package, the outside terminals 24 and 25 respectively corresponding to the electrode pads A1 and A2 of the pellet are respectively connected to the electrode pads 64 and 65 of the substrate of the product.

As shown in FIG. 9, as for the CSP, the pellet 10 is positioned face down. The electrode pad A1 (11) is connected to the outside terminal 44 by the bonding wire 40 and the wiring 42 of the CSP substrate. Likewise, the electrode pad A2 (12) is connected to the outside terminal 45 by the bonding wire 41 and the wiring 43 of the CSP substrate. As shown in FIG. 14, the outside terminals 45 and 44 respectively corresponding to the electrode pads A1 and A2 of the pellet are respectively connected to the electrode pads 64 and 65 provided on the substrate of the product.

In the above two face-up configurations, the electrode pads 11 and 12 of the pellet respectively assigned to the functions A1 and A2 are respectively electrically connected to the electrode pads 64 and 65 of the substrate of the product. The pads 64 and 65 correspond to the functions a1 and a2, respectively. On the other hand, in the face-down configurations, the pads 12 and 11 with the functions A2 and A1, respectively, are electrically connected to the pads 64 and 65, respectively (see Table 1 shown below).

TABLE 1

|  | Functions (Pads) | |
| --- | --- | --- |
| Electrode Pads on Product Substrate | a1(64) | a2(65) |
| Face-Up BGA Pads on Pellet | A1(11) | A2(12) |
| Face-Down CSP Pads on Pellet | A2(12) | A1(11) |

Generally, as for a product, the numerals of the functions a1 and a2 have absolute significance and cannot be replaced with each other. On the other hand, the numerals of the functions A1 and A2 on the semiconductor memory are not significant at all because the functions A1 and A2 are identical, so that signals can be interchanged between the same functions in a memory product. Specifically, the function A1 or A2 should only be electrically connected to the function a1 on the substrate without regard to the face-up/face-down position. Also, the function A2 or A1 should only be electrically connected to the function a2 on the substrate without regard to the face-up/face-down position.

As stated above, a group of electrode pads assigned to the same function are arranged on the pellet in each of the first and second quadrants divided by the center line of the pellet. In this condition, an electrode pad for a face-up position and an electrode pad for a face-down position are available for a single signal within the pellet. This obviates electric wiring inside of the pellet and prevents the performance of the memory from being deteriorated by a delay time ascribable to the wiring. In addition, it is not necessary to form at least one additional wiring layer in the package substrate of a semiconductor memory adapted for the face-up or face-down position.

Next, a case wherein pads assigned to the same function exist in either one of the third and fourth quadrants divided by a second center line perpendicular to the above first center line of the pellet will be described. As shown in FIG. 7, as for the BGA package, the pellet 10 is positioned face up. The electrode pad B1 (13) assigned to the function B is connected to the outside terminal 34 by the wire 30 and the wiring 32 of the substrate. Likewise, the electrode pad B2 (14) also assigned to the function B is connected to the outside terminal 35 by the wire 31 and the wiring 33 of the substrate. As shown in FIG. 14, the outside terminals 34 and 35 respectively associated with the electrode pads B1 and B2 of the pellet 10 are respectively connected to the electrode pads 66 and 67 of the substrate of the product.

As shown in FIG. 10, as for the CSP, the pellet 10 is positioned face down. The electrode pad B1 (13) assigned to the function B is connected to the outside terminal 54 by the bump 50 and the wiring 52 of the substrate. Likewise, the electrode pad B2 (14) also assigned to the function B is connected to the outside terminal 55 by the bump 51 and the wiring 53 of the substrate. As shown in FIG. 14, the outside terminals 55 and 54 respectively associated with the electrode pads B2 and B1 of the pellet 10 are respective connected to the electrode pads 66 and 67 of the substrate of the product.

To summarize the above configurations, in the face-up position, the pad 13 of the pellet 10 assigned to the function B1 is electrically connected to the electrode pad 66 of the substrate of the product which are assigned to the function b1. Also, the pad 14 of the pellet 10 assigned to the function B2 is electrically connected to the electrode pad 67 of the substrate of the product which are assigned to the function b2. In the face-down position, the pad 14 is electrically connected to the electrode pad 66 of the substrate of the product while the pad 13 is electrically connected to the electrode pad 67 of the substrate of the product (see Table 2 shown below).

TABLE 2

|  | Functions (Pads) | |
| --- | --- | --- |
| Electrode Pads on Product Substrate | b1(66) | b2(67) |
| Face-Up BGA Pads on Pellet | B1(13) | B2(14) |
| Face-Down CSP Pads on Pellet | B2(14) | B1(13) |

Generally, as for a product, the numerals of the functions b1 and b2 have absolute significance and cannot be replaced with each other. On the other hand, the numerals of the functions B1 and B2 on the semiconductor memory are not significant at all because the functions B1 and B2 are identical, so that signals can be interchanged between the same functions in a memory product. Specifically, the function B1 or B2 should only be electrically connected to the function b1 on the substrate without regard to the face-up/face-down position. Also, the function B2 or B1 should only be electrically connected to the function b2 on the substrate without regard to the face-up/face-down position.

As stated above, a group of electrode pads assigned to the same function are arranged on the pellet in either one of the third and fourth quadrants divided by the second center line of the pellet. In this condition, an electrode pad for a face-up position and an electrode pad for a face-down position are available for a single signal within the pellet. This obviates electric wiring inside of the pellet and prevents the performance of the memory from being deteriorated by a delay time ascribable to the wiring. In addition, it is not necessary to form at least one additional wiring layer in the package substrate of a semiconductor memory adapted for the face-up or face-down position. If desired, a group of electrode pads assigned to the same function may be arranged in both of the third and fourth quadrants.

Assume a case wherein electrode pads assigned to the same function, but inhibited from interchanging signals, exist together within a center line having a finite width. First, the face-up position will be described with reference to FIG. 12. As shown, the electrode pad 17 assigned to the function C1 is electrically connected to the ball or outside terminal 72c by the wire 70, wiring 72 of the uppermost layer of the substrate, line of in the substrate, and wiring 72b of the lowermost layer of the substrate. The electrode 18 assigned to the function C2 is electrically connected to the ball or outside terminal 73c by the wire 71, wiring 73 of the uppermost layer of the substrate, line 73a of the substrate, and wiring 73b of the lowermost layer of the substrate.

Further, as shown in FIG. 14, the balls 72c and 73c are respectively connected to the electrode pads 68 and 69 of the substrate of the product which are assigned to the functions c1 and c2, respectively. In this case, the relative position of the electrode pads 17 and 18 respectively assigned to the functions C1 and C2 and that of the outside terminals 72c and 73c also assigned to the functions C1 and C2 are identical, as seen in a perspective top view.

As shown in FIG. 13, in the face-down position, the electrode pad 17 assigned to the function C1 is electrically connected to the ball or outside terminal 75c by the bump and wiring 75 of the uppermost layer of the substrate, line 75a of the substrate, and wiring 75b of the lowermost layer of the substrate. Also, the electrode pad 18 assigned to the function C2 is electrically connected to the ball or outside terminal 74c by the bump and wiring 74 of the uppermost layer, line 74a of the substrate, and wiring 74b of the lowermost layer.

Further, as shown in FIG. 14, the balls 75c and 74c are respectively connected to the electrode pads 68 and 69 of the substrate of the product which are assigned to the functions c1 and c2, respectively. In this case, the relative position of the functions C1 and C2 and that of the electrode pads 17 and 18 are opposite to each other because of the unique wirings formed in the uppermost and lowermost layers of the substrate, as seen in a perspective top view. Stated another way, the relative position of the balls 62c and 73c respectively assigned to the functions C1 and C2 (see FIG. 12) and that of the balls 75c and 74c also respectively assigned to the functions C1 and C2 (see FIG. 13) are identical, as seen in a perspective top view.

As stated above, in the face-up configuration, the electrode pads 17 and 18 respectively assigned to the functions C1 and C2 are respectively electrically connected to the electrode pads 68 and 69 assigned to the functions c1 and c2, respectively. In the face-down configuration, the electrode pads 17 and 18 are connected to the electrode pads 68 and 69, respectively (see Table 3 shown below).

TABLE 3

|  | Functions (Pads) | |
| --- | --- | --- |
| Electrode Pads on Product Substrate | c1(68) | c2(69) |
| Face-Up BGA Pads on Pellet | C1(17) | C2(18) |
| Face-Down CSP Pads on Pellet | C1(17) | C2(18) |

Because the numerals of the functions c1 and c2 have absolute significance in a product and because the functions C1 and C2 each has a particular subsidiary function in a semiconductor memory, the functions C1 and C2 are not allowed to interchange signals in a semiconductor memory product. However, the function C1 of the semiconductor memory is electrically connected to the function c1 of the substrate without regard to the face-up/face-down position. Likewise, the function C2 of the semiconductor memory is connected to the function c2 of the substrate without regard to the face-up/face-down position.

A group of electrode pads assigned to the same function are arranged within the center line of the pellet whose width is one half of the length of the side of the pellet. In this condition, an electrode pad for a face-up position and an electrode pad for a face-down position are available for a single signal within the pellet. This obviates electric wiring inside of the pellet and prevents the performance of the memory from being deteriorated by a delay time ascribable to the wiring. In addition, it is not necessary to form at least one additional wiring layer in the package substrate of a semiconductor memory adapted for the face-up or face-down position.

In summary, in accordance with the present invention, a group of electrode pads assigned to a plurality of same functions are arranged in both of the first and second quadrants divided by a first center line of a pellet. In another configuration, a group of electrode pads assigned to at least one function are arranged in one or both of the third and fourth quadrants divided by a second center line perpendicular to the first center line. In still another configuration, a group of electrode pads assigned to the same function are arranged within a third center line perpendicular to the first center line and having a width which is one half of the length of the side of the pellet. In any one of such configurations, an electrode pad for face-up mounting and an electrode pad for face-down mounting are available within the pellet for a single signal and electrically connected within the pellet. This obviates an increase in the area of the pellet which would increase the production cost, and prevents the memory performance from being deteriorated by a delay time ascribable to wiring.

Further, the present invention is practicable without resorting to any extra layer in the package substrate of a semiconductor memory adapted for face-up or face-down mounting and therefore with a minimum of production cost.

Various modifications will become possible for those skilled in the art after receiving the teachings of the present disclosure without departing from the scope thereof. For example, the present invention is effectively applicable to any desired semiconductor memory function, e.g., an address selecting function, a data inputting and outputting function, a data inputting function, a data outputting function, or a memory control function. While the illustrative embodiment has concentrated on a BGA package and a CSP, the present invention is practicable with any other package configuration capable of implementing face-up and face-down pellet mounting.

What is claimed is:

1. In a semiconductor memory, a group of electrode pads for connecting said semiconductor memory to outside and assigned to a plurality of same functions are arranged on a surface of a memory pellet in both of a first and a second quadrant divided by a first center line of said memory pellet, wherein a group of electrode pads assigned to at least one same function are arranged in one or both of a third and a fourth quadrant divided by a second center line of said memory pellet perpendicular to said first center line, and wherein a group of electrode pads assigned to a same function are arranged about a third center line of said memory pellet within an area having a width which is one half of a length of a side of said memory pellet, said third center line being parallel to said first center line.

2. A semiconductor memory as claimed in claim 1, wherein said function comprises a data inputting function and a data outputting function.

3. A semiconductor memory as claimed in claim 1, wherein said plurality of same functions include a data inputting function and a data outputting function.

4. A semiconductor memory as claimed in claim 1, wherein said plurality of same functions include a data inputting and outputting function.

5. A semiconductor memory as claimed in claim 1, wherein said plurality of same functions include an address signal inputting function.

6. A semiconductor memory as claimed in claim 1, wherein said plurality of same functions include a memory control signal inputting function.

7. A semiconductor memory as claimed in claim 1, wherein said plurality of same functions include a power feeding function.

8. A semiconductor memory as claimed in claim 1, wherein said plurality of same functions include a clock outputting function.

9. In a semiconductor memory, a group of electrode pads for connecting said semiconductor memory to outside and assigned to a plurality of same functions are arranged on a surface of a memory pellet in both of a first and a second quadrant divided by a first center line of said memory pellet, wherein a group of electrode pads assigned to a same function are arranged with respect to a third center line of said memory pellet and in an area and having a width which is one half of a length of a side of said memory pellet, wherein said third center line is parallel to said first center line.

10. In a semiconductor memory, a first electrode pad associated with a function and a second electrode pad associated with a similar function for connecting said semiconductor memory to outside, said first electrode pad arranged on a surface of a memory pellet in a first quadrant, said second electrode pad arranged on the surface of the memory pellet in a second quadrant, said first and second quadrants being divided by a first center line of said memory pellet, wherein when said memory pellet is arranged in an upward orientation then the first electrode pad and the second electrode pad receive signals associated with the function and when said memory pellet is arranged in a downward orientation then the first electrode pad and the second electrode pad receive signals associated with the function.

11. A semiconductor memory as claimed in claim 10, wherein said function comprises a data inputting function and a data outputting function.

12. A semiconductor memory as claimed in claim 10, wherein a group of electrode pads assigned to another similar function are arranged in one or both of a third and a fourth quadrant divided by a second center line of said memory pellet perpendicular to said first center line.

13. A semiconductor memory as claimed in claim 10, wherein a group of electrode pads assigned to another similar function are arranged with respect to a third center line of said memory pellet and in an area having a width which is one half of a length of a side of said memory pellet, said third center line being parallel to said first center line.

14. In a semiconductor memory, a first group of electrode pads for connecting said semiconductor memory to outside and assigned to similar functions are arranged on a surface of a memory pellet in both of a first and a second quadrant divided by a first center line of said memory pellet, wherein a second group of electrode pads assigned to another function are arranged in one or both of a third and a fourth quadrant divided by a second center line of said memory pellet perpendicular to said first center line, and wherein when said memory pellet is arranged in an upward orientation then the first group of electrode pads receive signals associated with the first function and when said memory pellet is arranged in a downward orientation then the first group of electrode pads receive signals associated with the first function.

15. A semiconductor memory as claimed in claim 14, wherein said first function comprises a data inputting function and a data outputting function.

16. A semiconductor memory as claimed in claim 14, wherein a third group of electrode pads assigned to a same function are arranged about a third center line of said memory pellet and in an area having a width which is one half of a length of a side of said memory pellet, said third center line being parallel to said first center line.

* * * * *